(12) United States Patent
Tung et al.

(10) Patent No.: US 11,004,734 B2
(45) Date of Patent: *May 11, 2021

(54) METAL-BASED ETCH-STOP LAYER

(71) Applicant: Taiwan Semiconductor Manufacturing Co., Ltd., Hsin-Chu (TW)

(72) Inventors: Szu-Ping Tung, Taipei (TW); Yu-Kai Lin, Hsinchu (TW); Jen Hung Wang, Hsinchu (TW); Shing-Chyang Pan, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/672,879

(22) Filed: Nov. 4, 2019

(65) Prior Publication Data
US 2020/0066581 A1 Feb. 27, 2020

Related U.S. Application Data

(63) Continuation of application No. 15/964,306, filed on Apr. 27, 2018, now Pat. No. 10,468,297.

(51) Int. Cl.
*H01L 21/768* (2006.01)
*H01L 23/532* (2006.01)
*H01L 21/311* (2006.01)

(52) U.S. Cl.
CPC .. *H01L 21/76832* (2013.01); *H01L 21/31116* (2013.01); *H01L 21/7684* (2013.01);
(Continued)

(58) Field of Classification Search
None
See application file for complete search history.

(56) References Cited

U.S. PATENT DOCUMENTS 9,437,484 B2 9/2016 JangJian et al.
9,515,021 B1 12/2016 Chen et al.
(Continued)

FOREIGN PATENT DOCUMENTS

CN 105529321 A 4/2016
CN 107230660 A 10/2017

*Primary Examiner* — J.E. Schoenholtz
(74) *Attorney, Agent, or Firm* — Haynes and Boone, LLP

(57) ABSTRACT

A semiconductor structure includes a conductive feature, a first metal-based etch-stop layer over the underlying structure, a metal-free etch-stop layer over the first metal-based etch-stop layer, a second metal-based etch-stop layer over the metal-free etch-stop layer, an interlayer dielectric layer over the second metal-based etch-stop layer, and an interconnect structure extending through the first metal-based etch-stop layer, metal-free etch-stop layer, and the second metal-based etch-stop layer, wherein a bottom portion of the conductive interconnect structure directly contacts the conductive feature. The first metal-based etch-stop layer may include a first metallic component having one of aluminum, tantalum, titanium, or hafnium, and the second metal-based etch-stop layer may include a second metallic component the same as or different from the first metallic component. The first metal-based etch-stop layer and the second metal-based etch-stop layer may both be free of silicon.

20 Claims, 8 Drawing Sheets

(52) U.S. Cl.
CPC .... *H01L 23/5329* (2013.01); *H01L 23/53223* (2013.01); *H01L 23/53266* (2013.01)

(56) References Cited

U.S. PATENT DOCUMENTS

| | | | |
|---|---|---|---|
| 9,761,488 B2 | 9/2017 | Cheng et al. | |
| 1,009,024 A1 | 10/2018 | JangJian et al. | |
| 1,021,109 A1 | 2/2019 | Huang et al. | |
| 10,468,297 B1* | 11/2019 | Tung | H01L 21/76816 |
| 2003/0134521 A1* | 7/2003 | Guo | H01L 21/31116 |
| | | | 438/792 |
| 2004/0048468 A1 | 3/2004 | Liu et al. | |
| 2005/0110153 A1 | 5/2005 | Wu et al. | |
| 2008/0179741 A1 | 7/2008 | Streck et al. | |
| 2008/0311739 A1* | 12/2008 | Besling | H01L 23/53295 |
| | | | 438/643 |
| 2013/0052758 A1* | 2/2013 | Krusor | H01L 22/12 |
| | | | 438/14 |
| 2015/0262864 A1* | 9/2015 | Okamoto | H01L 21/31144 |
| | | | 438/671 |
| 2016/0111325 A1 | 4/2016 | JangJian et al. | |
| 2016/0343660 A1* | 11/2016 | Kim | H01L 23/5226 |
| 2016/0358854 A1 | 12/2016 | JangJian et al. | |
| 2017/0018458 A1 | 1/2017 | Cheng et al. | |
| 2017/0194242 A1 | 7/2017 | Huang et al. | |
| 2019/0043803 A1* | 2/2019 | You | H01L 21/76834 |
| 2019/0051600 A1* | 2/2019 | Oh | H01L 21/76816 |
| 2019/0333807 A1 | 10/2019 | Tung et al. | |

\* cited by examiner

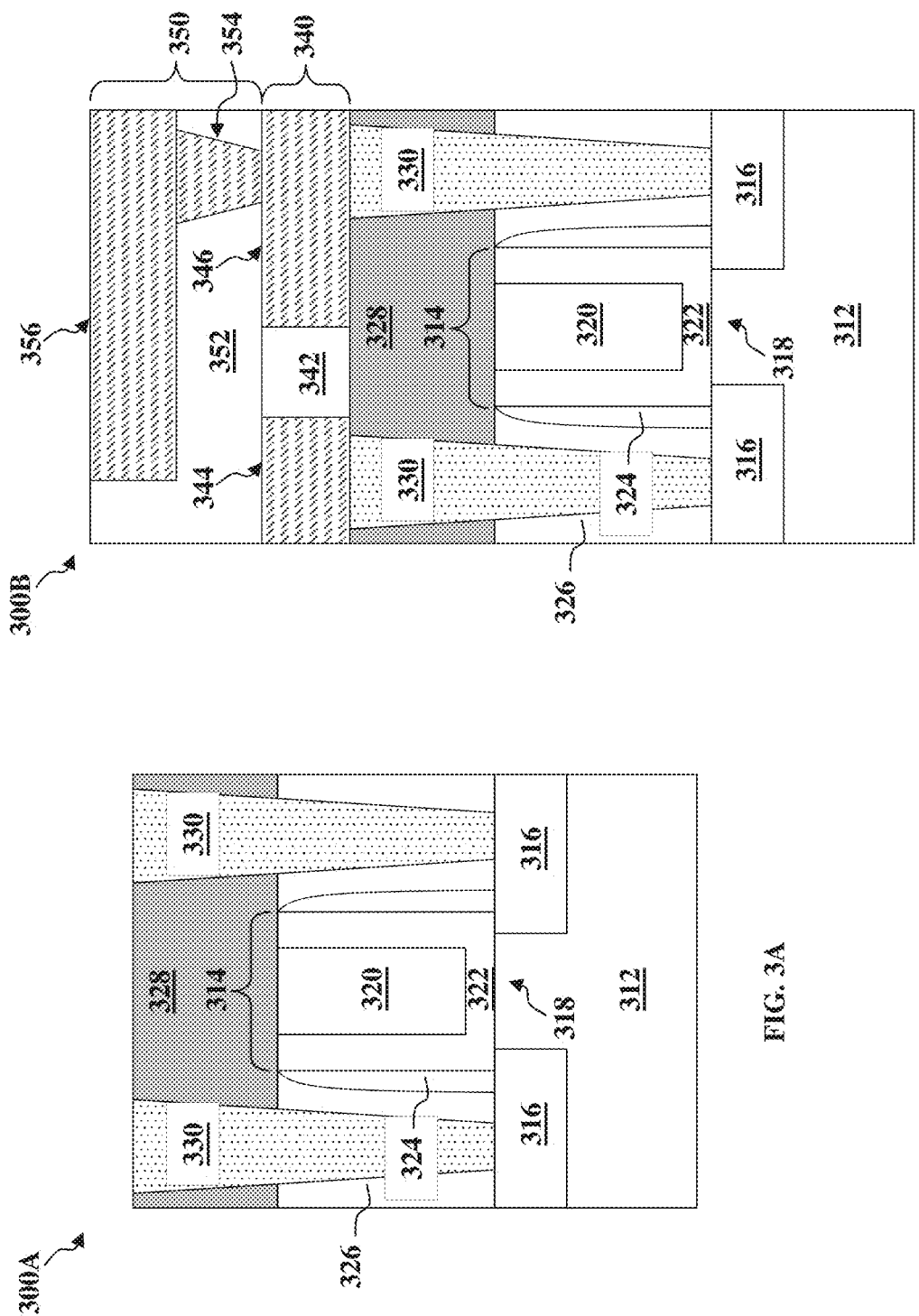

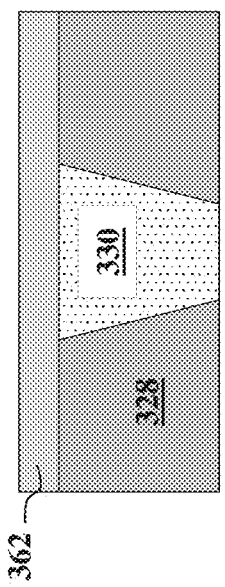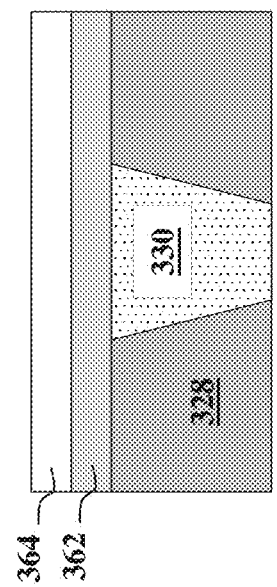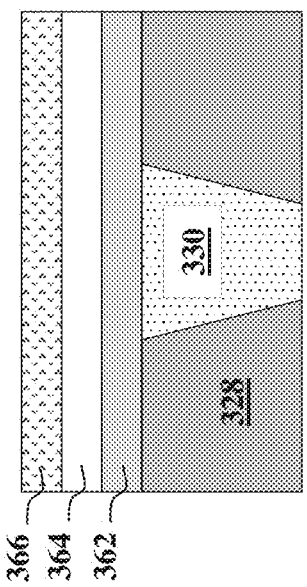

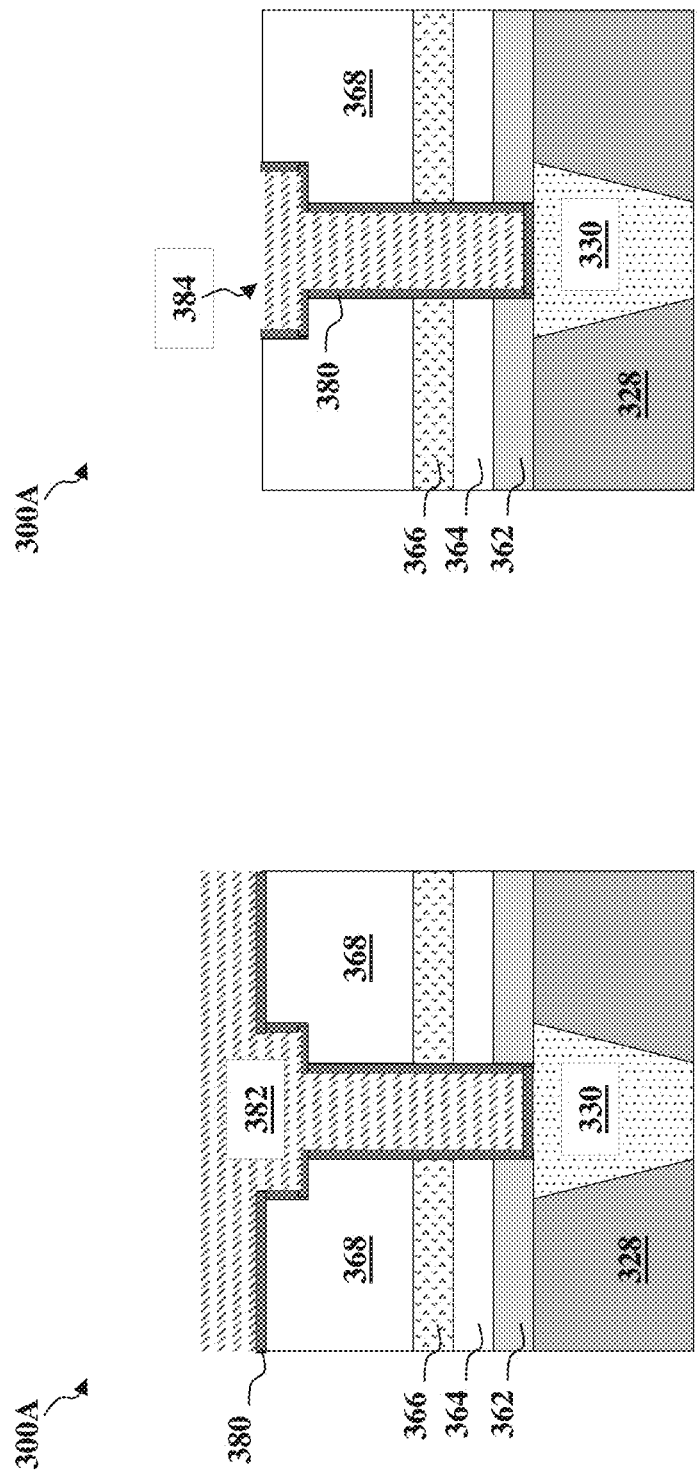

METAL-BASED ETCH-STOP LAYER

PRIORITY DATA

The present application is a continuation of U.S. patent application Ser. No. 15/964,306, filed Apr. 27, 2018, which is incorporated herein by reference in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, formation of conductive interconnect features in IC devices may be affected by performance of an etch-stop layer implemented during multiple patterning processes when length scales of the devices continue to decrease. As a result, improvements in this area are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A and 3B are fragmentary cross-sectional views of an exemplary semiconductor device according to various aspects of the present disclosure.

FIGS. 4, 5, 6, 7, 8, 9, 10, 11, 12, 13, 14, 15, and 16 are fragmentary cross-sectional views of an exemplary semiconductor device at intermediate stages of an embodiment of the method illustrated in FIGS. 1A and 1B according to various aspects of the present disclosure.

DETAILED DESCRIPTION

Figure 1A:
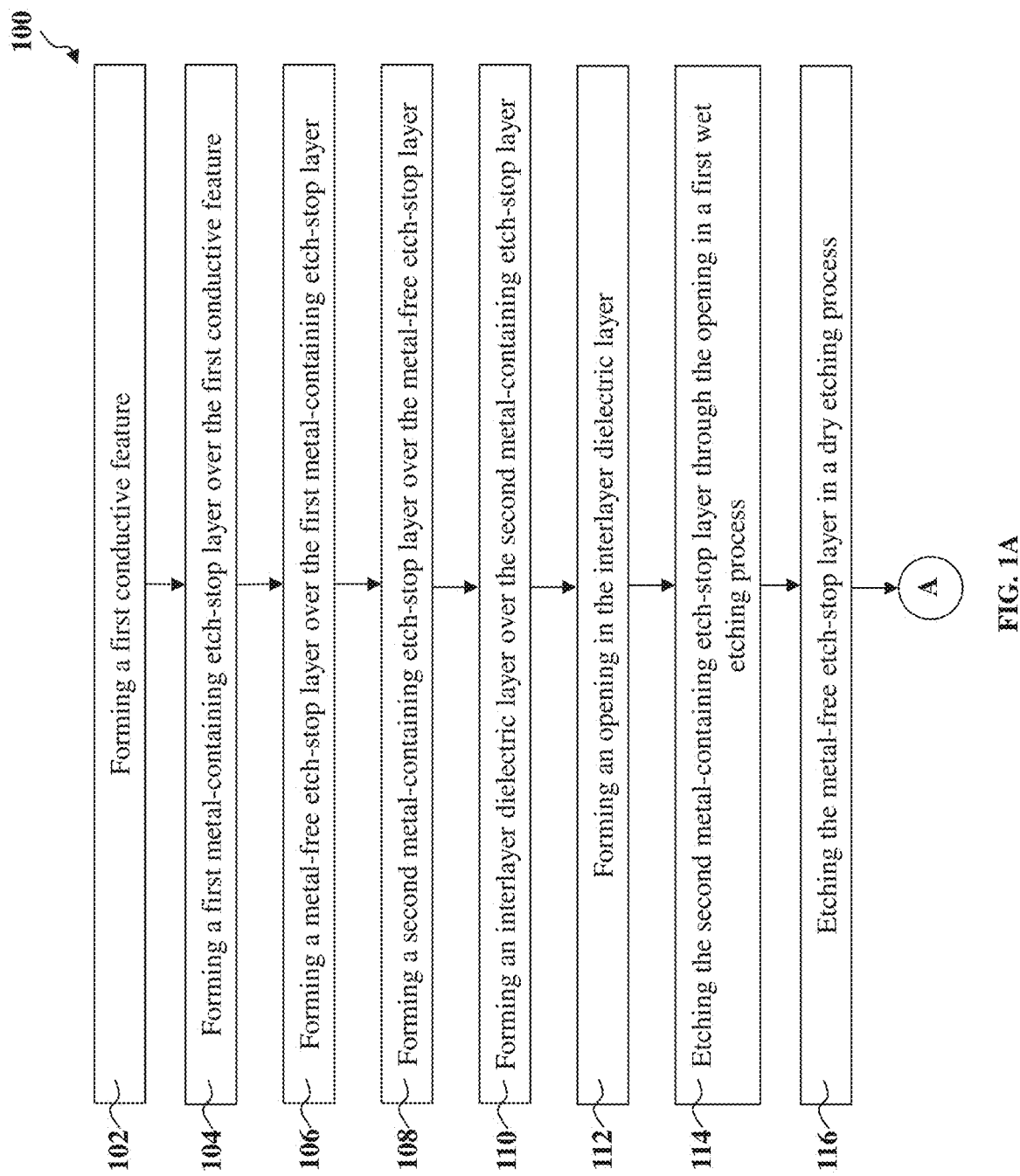
FIGS. 1A and 1B illustrate a flowchart of an exemplary method for fabricating a semiconductor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to methods of semiconductor device fabrication, and more particularly to methods of forming conductive interconnect features in semiconductor devices. Upon forming conductive features (e.g., source/drain features and metal gates), vertical interconnect features (e.g., contacts and/or vias), horizontal interconnect features (e.g., metal lines), and/or multilayer interconnect features (e.g., metallization layers and interlayer dielectric layers) can be formed by multiple patterning and etching processes to further device fabrication. During these processes, etch-stop layers may be implemented to protect underlying layers from being etched unintentionally. However, as features sizes continue to decrease, etchant loading effect becomes more pronounced, leading to incomplete formation of patterned features (e.g., an under-etching effect) or unintentional punch-through of an etch-top layer during patterning. Accordingly, the present disclosure provides methods and materials for improving multiple patterning processes associated with forming conductive interconnect features during IC device fabrication. The semiconductor devices disclosed herein may be, for example, complementary metal-oxide-semiconductor (CMOS) devices comprising a p-type metal-oxide-semiconductor (PMOS) device and an n-type metal-oxide-semiconductor (NMOS) device. With respect to structures, the devices may be two-dimensional, planar MOS field-effect transistor (MOSFET) devices or three-dimensional, non-planar fin-like field effect transistor (FinFET) devices. It is understood, however, that the present disclosure should not be limited to a particular type of device.

Figure 1B:
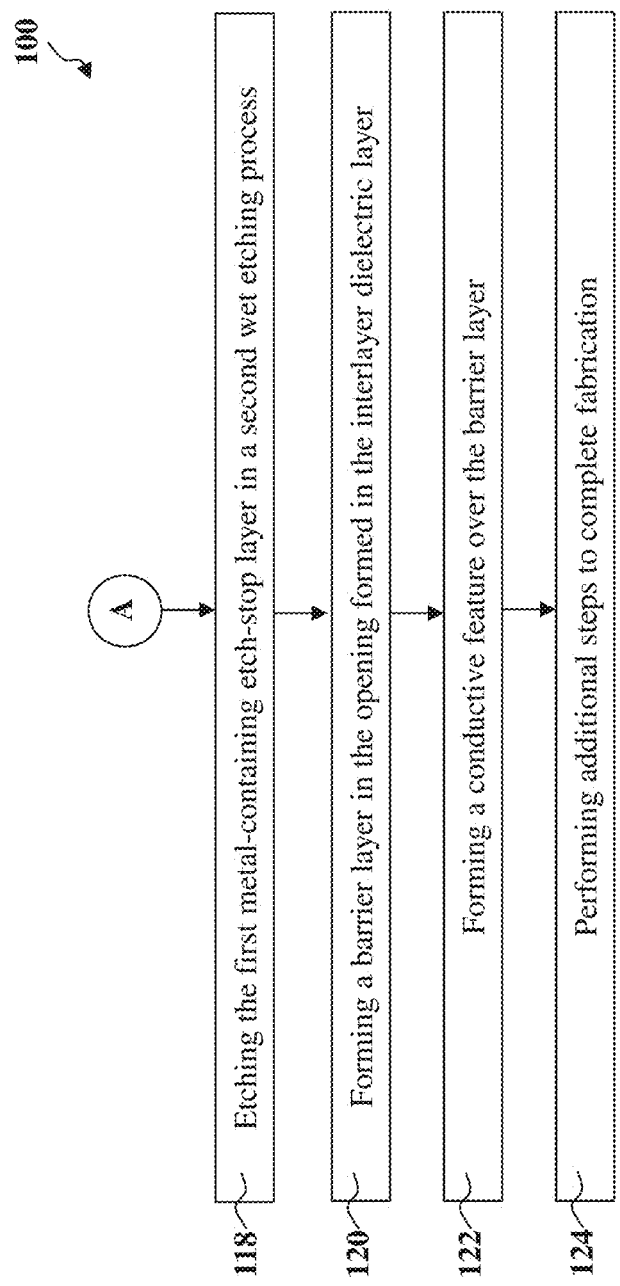
Figure 2:
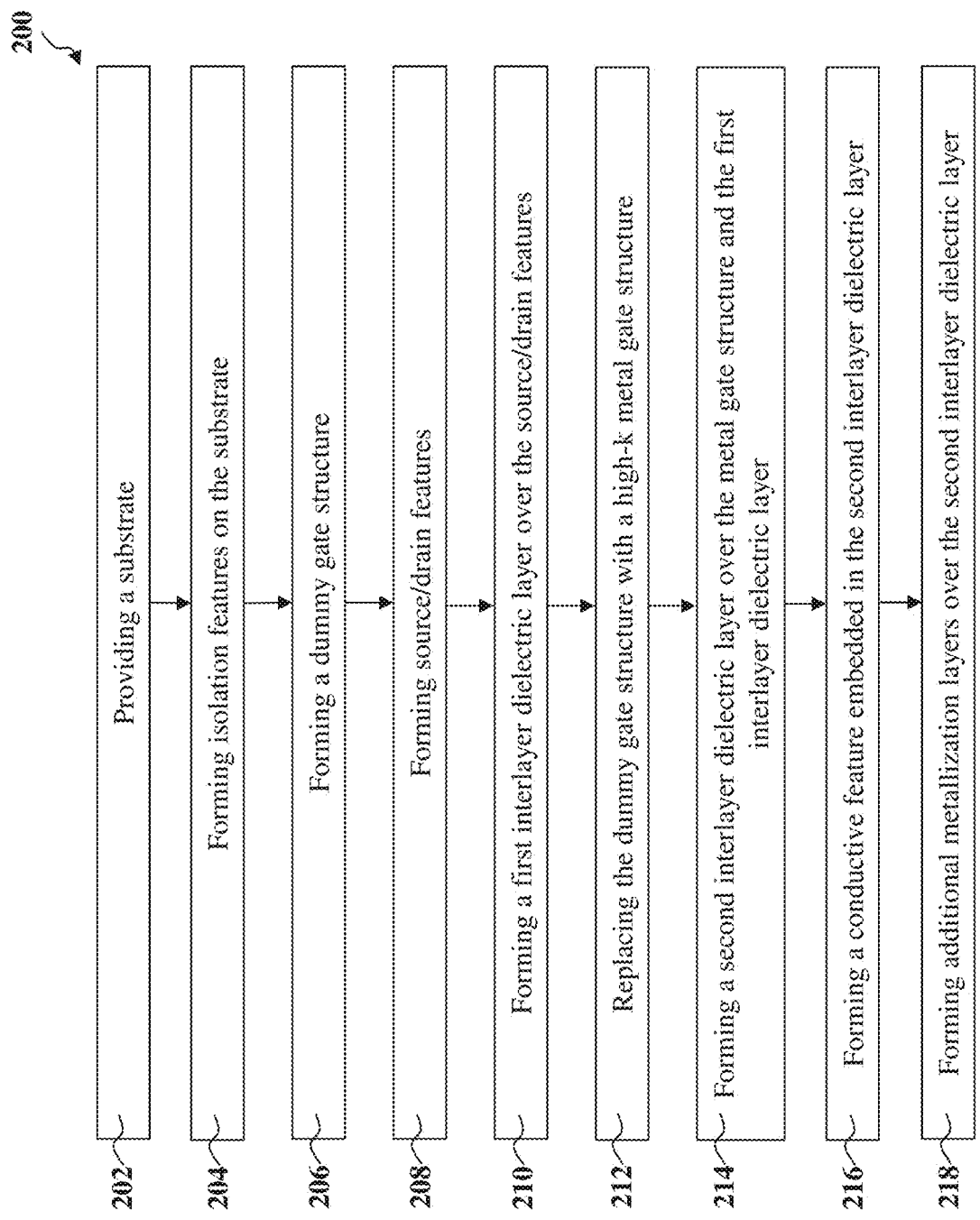
FIG. 2 illustrates a flowchart of an exemplary method for fabricating a semiconductor device according to various aspects of the present disclosure.
Figure 8:
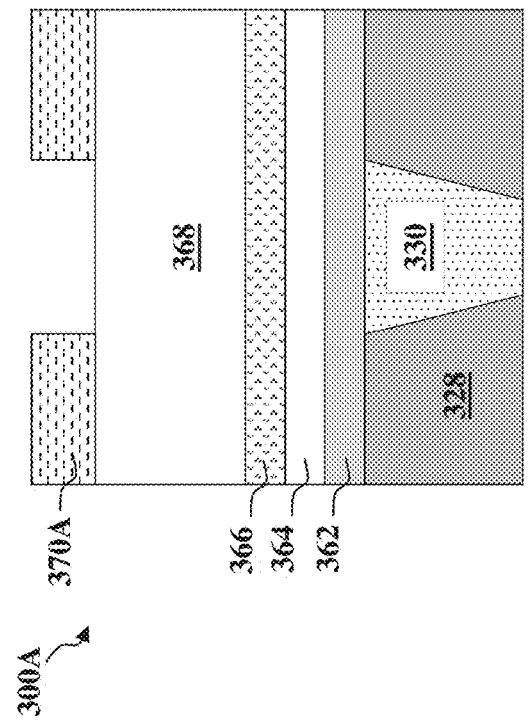

FIGS. 1A-1B illustrate a flowchart of a method 100 for fabricating a workpiece 300 according to some aspects of the present disclosure. FIG. 2 illustrates a flowchart of a method 200 for fabricating a portion of the workpiece 300 according to some aspects of the present disclosure. The methods 100 and 200 are merely examples, and are not intended to limit the present disclosure beyond what is explicitly recited in the claims. Additional operations can be provided before, during, and after the methods 100 and 200, and some operations described can be replaced, eliminated, or moved around for additional embodiments of the process. Intermediate steps of the method 100 are described with reference to cross-sectional views of the workpiece 300 as shown in FIGS. 3A, 3B, and 4-16. Fragmentary cross-sectional views of the workpiece 300 processed using the method 200 are illustrated in FIGS. 3A and 3B. For clarity and ease of explanation, some elements of the figures have been simplified.

Referring to FIGS. 1A, 3A, and 3B, the method 100 provides an underlying structure 300A or 300B at operation 102. The underlying structures 300A and 300B may each include any portion of a semiconductor device (e.g., a CMOS device). In many embodiments, the underlying structures 300A and 300B each includes at least one conductive feature (e.g., 330 in FIG. 3A; 344, 346, 354, and 356 in FIG. 3B). Although the underlying structures 300A and 300B illustrated in FIGS. 3A and 3B are planar device, the present disclosure may also provide three-dimensional devices such as FinFET devices according to some embodiments. Subsequent operations of the method 100 may be implemented on the underlying structure 300A or 300B. For purposes of clarity and simplicity, the subsequent operations of the method 100 illustrated in FIGS. 4-16 are described using a portion of the underlying structure 300A as an example, though the present disclosure is by no means limited thereto.

Referring back to FIGS. 1A and 4, the method 100 forms a lower etch-stop layer 362 over the underlying structure 300A at operation 104. The lower etch-stop layer 362 may include a metal-based dielectric material such as a metal oxide, a metal nitride, a metal carbide, a metal oxynitride, or other suitable dielectric material. In some embodiments, the lower etch-stop layer 362 includes multiple dielectric materials as described above. In many embodiments, the lower etch-stop layer 362 includes one or more metallic component such as aluminum (Al), tantalum (Ta), titanium (Ti), hafnium (Hf), molybdenum (Mo), silver (Ag), gold (Au), manganese (Mn), zirconium (Zr), other suitable metallic components, or combinations thereof. In one such example, the lower etch-stop layer 362 may include aluminum oxide. In another example, the lower etch-stop layer 362 may include aluminum oxide, aluminum nitride, aluminum oxynitride, other aluminum-containing dielectric materials, or combinations thereof. In yet another example, the lower etch-stop layer 362 may include titanium oxide, hafnium oxide, other dielectric materials, or combinations thereof. Notably, the lower etch-stop layer 362 is substantially free of silicon (i.e., elementary silicon and/or silicon-containing compounds). In the present disclosure, the term "substantially free" denotes a level of concentration below about 0.1 atomic percent. The lower etch-stop layer 362 may be formed by any suitable method such as chemical vapor deposition (CVD), physical vapor deposition (PVD), atomic layer deposition (ALD), plating, other suitable methods, or combinations thereof. In the depicted embodiments, the lower etch-stop layer 362 is formed to a thickness of about 10 angstrom to about 100 angstrom.

Referring to FIGS. 1A and 5, the method 100 forms a middle etch-stop layer 364 over the lower etch-stop layer 362 at operation 106. In many embodiments, the middle etch-stop layer 364 is substantially free of any metallic component in the form of a pure metal, a metal compound (e.g., a metal oxide, a metal nitride, a metal oxynitride, a metal silicide, a metal carbide, etc.), a metal alloy (e.g., a combination of multiple metallic components), other metallic components, or combinations thereof. In the present disclosure, the middle etch-stop layer 364 may alternatively be referred to as a metal-free etch stop layer. In some embodiments, the middle etch-stop layer 364 includes a dielectric material such as an oxide, a nitride, a carbide, an oxynitride, other suitable dielectric material, or combinations thereof. In the depicted embodiment, the middle etch-stop layer 364 includes silicon oxide, silicon nitride, silicon carbide, silicon oxynitride, other suitable silicon-containing materials, or combinations thereof. The middle etch-stop layer 364 may be formed using any suitable method such as spin-on coating, flowable CVD, CVD, PVD, other suitable methods, or combinations thereof. In the depicted embodiment, the middle etch-stop layer 364 is formed by spin-on coating a metal-free dielectric material such as spin-on-glass (SOG). In many embodiments, the middle etch-stop layer 364 is formed to a thickness of about 150 nm to about 500 nm.

Referring to FIGS. 1A and 6, the method 100 forms an upper etch-stop layer 366 over the middle etch-stop layer 364 at operation 108. In many embodiments, the upper etch-stop layer 366 is similar to the lower etch-stop layer 362 in that it also includes a metal-based dielectric material such as a metal oxide, a metal nitride, a metal carbide, a metal oxynitride, or other suitable dielectric material. In some embodiments, the upper etch-stop layer 366 includes multiple dielectric materials. In many embodiments, the upper etch-stop layer 366 includes one or more metallic component such as aluminum (Al), tantalum (Ta), titanium (Ti), hafnium (Hf), molybdenum (Mo), silver (Ag), gold (Au), manganese (Mn), zirconium (Zr), other suitable metallic components, or combinations thereof. In one such example, the upper etch-stop layer 366 may include aluminum oxide. In another example, the upper etch-stop layer 366 may include aluminum nitride, aluminum oxide, aluminum oxynitride, other aluminum-containing dielectric materials, or combinations thereof. In yet another example, the upper etch-stop layer 366 may include tantalum oxide, zirconium oxide, other dielectric materials, or combinations thereof. In some embodiments, the lower etch-stop layer 362 and the upper etch-stop layer 366 include a common metallic component. Notably, also, similar to the lower etch-stop layer 362, the upper etch-stop layer 366 is substantially free of silicon (i.e., elementary silicon and/or silicon-containing compounds). The upper etch-stop layer 366 may be formed by any suitable method such as CVD, PVD, ALD, plating, other suitable methods, or combinations thereof. In the depicted embodiments, the upper etch-stop layer 366 is formed to a thickness of about 10 angstrom to about 100 angstrom. In some embodiments, the method 100 omits forming the upper etch-stop layer 366. In some embodiments, the forming of the upper etch-stop layer 366 or the forming of the lower etch-stop layer 362 is optional. Furthermore, an order in which the lower etch-stop layer 362, the middle etch-stop layer 364, and the upper etch-stop layer 366 are formed is not limited to the embodiments described herein and may be altered based on design requirements of the device.

In many embodiments, the thickness of the metal-free etch-stop layer (e.g., the middle etch-stop layer 364) is at least 1.5 times that of the metal-based etch-stop layer (e.g., the lower etch-stop layer 362 or the upper etch-stop layer 366). Such difference in layer thickness may be attributed to at least two factors. First, the metal-based etch-stop layers generally possess greater resistance to chemical etching (dry and/or wet etching) than the metal-free layer and may therefore be formed to a lesser thickness to achieve a desired level of etching selectivity without affecting resolution of an etched feature (e.g., affecting line width roughness and/or line edge roughness of a line pattern). Second, because the metal-based etch-stop layers are generally formed by a deposition method (e.g., ALD, CVD, etc.), they may be formed to a lesser thickness than the metal-free etch-stop layer, which is generally formed by spin-coating.

Figure 7:
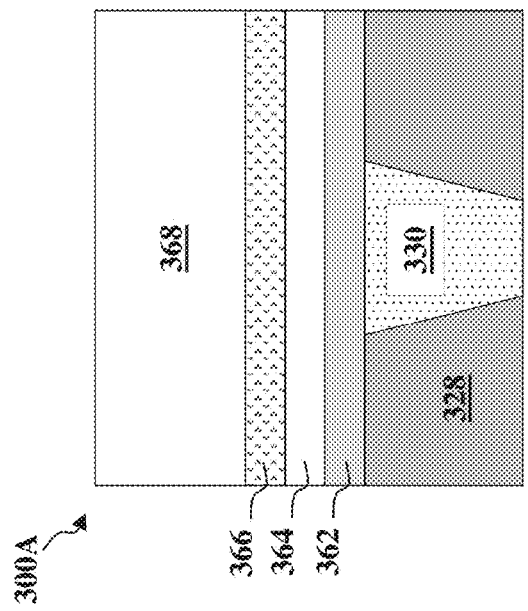

Referring to FIGS. 1A and 7, the method 100 forms an interlayer dielectric (ILD) layer 368 over the upper etch-stop layer 366 at operation 110. The ILD layer 368 may include any suitable material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), low-k dielectric material and/or other suitable dielectric materials. In some embodiments, the ILD layer 368 is similar to the ILD layer 326, the ILD layer 328, the ILD layer 342, or the ILD layer 352 (see FIG. 3B).

As will be described in details below, the method 100 at operations 112 through 122 forms a conductive feature that extends through the ILD layer 368, the upper etch-stop layer 366, the middle etch-stop layer 364, and the lower etch-stop layer 362 to contact the underlying conductive feature 330 (or 356).

Figure 10:
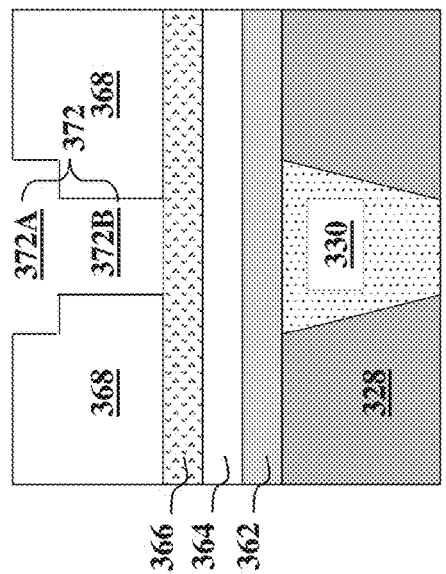
Figure 9:
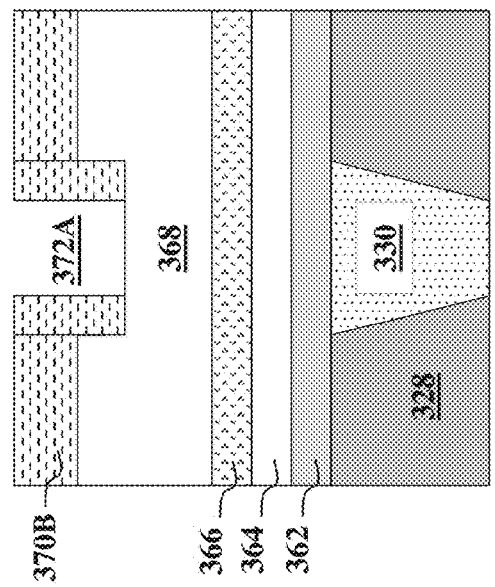

Referring to FIG. 1A and FIGS. 8-10, the method 100 forms an opening 372 (FIG. 10) in the ILD layer 368 at operation 112. In the depicted embodiment, the method 100 implements a dual-damascene process, details of which are described below, to form the opening 372; however, the other methods, such as a series of single-damascene processes, may also be implemented. The opening 372 may be formed by a series of patterning processes. The patterning processes may include forming a resist layer (e.g., a photoresist layer; not shown), which may further include one or more underlying layers (e.g., hard mask layer and/or a bottom anti-reflective coating (BARC) layer), exposing the photoresist layer, baking the exposed resist layer, developing the exposed resist layer, and subsequently etching the underlying layers using the patterned resist layer as an etch mask. The etching process may include wet etching, dry etching, reactive ion etching (RIE), or other suitable etching methods. In the depicted embodiment, referring to FIG. 8, the method 100 forms a patterned photoresist layer 370A over the ILD layer 368. The patterned photoresist layer 370A may then be used as an etch mask to form a top portion 372A (e.g., a trench) of the opening 372. In some embodiments, a hard mask layer is formed over a top surface of the ILD layer 368 prior to forming the patterned photoresist layer 370A. In one example, the hard mask layer may be a nitride-containing layer such as titanium nitride. The etching process may include wet etching, dry etching, RIE, or other suitable etching methods. The patterned photoresist layer 370A may be subsequently removed using any suitable method such as plasma ashing. Referring to FIG. 9, the method 100 then forms another patterned photoresist layer 370B over portions of the ILD layer 368 and repeats the etching process to form a bottom portion 372B (e.g., a hole) of the opening 372 (FIG. 10). Alternatively, the method 100 may form the bottom portion 372B in a first patterning process similar to the process described above, followed by forming the top portion 372A in a second patterning process. In the depicted embodiment, the forming of the opening 372 does not substantially remove portions of the upper etch-stop layer 366 as the etching process implemented during the operation 112 demonstrates etch selectivity of the ILD layer 368.

Figure 11:
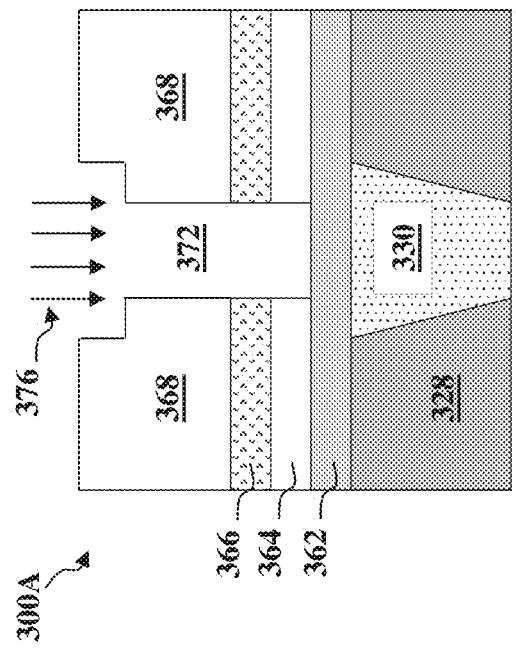

Referring to FIGS. 1A and 11, the method 100 etches the upper etch-stop layer 366 at operation 114. In the depicted embodiment, the method 100 implements a wet etching process to remove a portion of the upper etch-stop layer 366, which includes a metal-based dielectric material. In some embodiments, the wet etching process implements an etching solution 374 that includes hydrofluoric acid (HF), ammonium hydroxide ($NH_4OH$), nitric acid ($HNO_3$), hydrogen peroxide ($H_2O_2$), hydrogen chloride (HCl), sulfuric acid ($H_2SO_4$), tetramethylammonium hydroxide (TMAH), other suitable wet etching solution, or combinations thereof. For example, the etching solution 374 may utilize an $HCl/H_2O_2/H_2O$ solution, an $HNO_3/H_2O_2/HF$ solution, an $HNO_3/H_3PO_4/H_2O$ solution, an $NH_4OH/H_2O_2/H_2O$ solution (known as an ammonia-peroxide mixture (APM)), an $H_2SO_4/H_2O_2$ solution, an $HF/H_2O_2/H_2O$ solution, other etching solutions, or combinations thereof. In the depicted embodiment, the method 100 implements an APM solution (for etching, for example, an aluminum-based dielectric material), an $HNO_3/H_3PO_4/H_2O$ solution (for etching, for example, an aluminum-based dielectric material), an $HF/H_2O_2/H_2O$ solution (for etching, for example, a titanium-based dielectric material), and/or $H_2SO_4$ (for etching, for example, a titanium-based dielectric material). As a result, the method 100 etches through the upper etch-stop layer 366 and exposes a portion of the middle etch-stop layer 364 at operation 114. In many embodiments, the wet etching process selectively etches through the upper etch-stop layer 366 without substantially removing portions of the underlying middle etch-stop layer 364.

Figure 12:
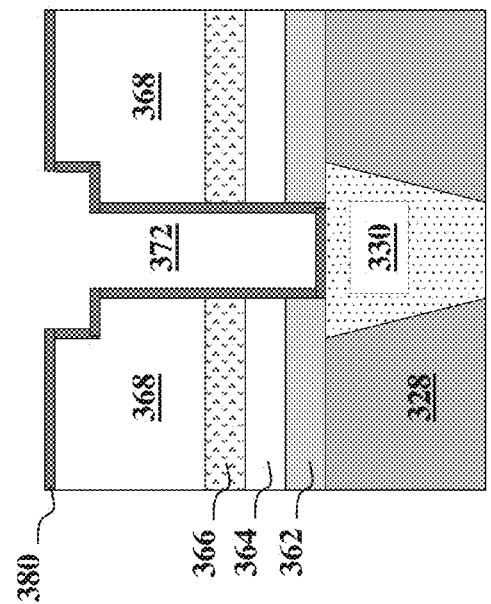

Referring to FIGS. 1A and 12, the method 100 etches the middle etch-stop layer 364 at operation 116. In the depicted embodiment, the method 100 implements a dry etching process to remove a portion of the middle etch-stop layer 364, which is substantially free of any metallic component. In some embodiments, the dry etching process employs an etchant gas 376 that includes a fluorine-containing etchant gas (e.g., $CF_4$, $SF_6$, $CH_2F_2$, $CHF_3$, and/or $C_2F_6$), an oxygen-containing gas, a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, helium, other suitable gases and/or plasmas, or combinations thereof. In the depicted embodiment, the dry etching process employs a fluorine-containing etchant gas such as $CF_x$ or $CHF_x$, where x is an integer greater than 1. As a result, the method 100 etches through the middle etch-stop layer 364 and exposes a portion of the lower etch-stop layer 362 at operation 116. In many embodiments, the dry etching process selectively etches through the middle etch-stop layer 364 without substantially removing portions of the underlying lower etch-stop layer 362.

Figure 13:
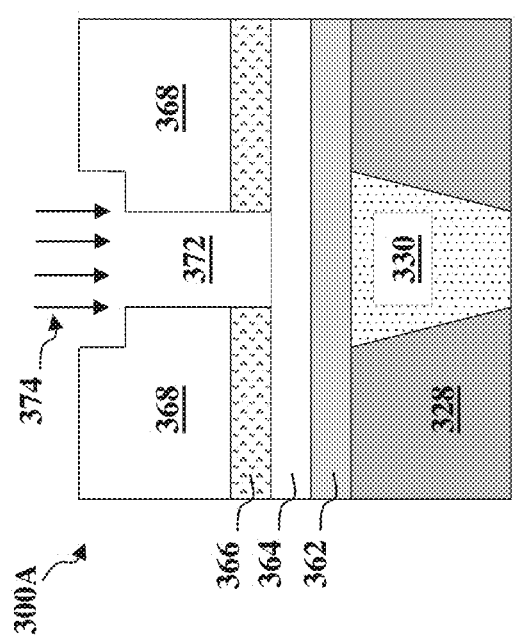

Referring to FIGS. 1B and 13, the method 100 etches the lower etch-stop layer 362 at operation 118. In the depicted embodiment, the method 100 implements a wet etching process to remove a portion of the lower etch-stop layer 362, which includes a metal-based dielectric material. In some embodiments, the wet etching process implements an etching solution 378 that includes ammonium hydroxide ($NH_4OH$), nitric acid ($HNO_3$), hydrofluoric acid (HF), hydrogen peroxide ($H_2O_2$), hydrogen chloride (HCl), sulfuric acid ($H_2SO_4$), tetramethylammonium hydroxide (TMAH), other suitable wet etching solution, or combinations thereof. For example, the etching solution 378 may utilize an $HCl/H_2O_2/H_2O$ solution, an $HNO_3/H_2O_2/HF$ solution, an $HNO_3/H_3PO_4/H_2O$ solution, an $NH_4OH/H_2O_2/H_2O$ solution (known as an ammonia-peroxide mixture (APM)), an $H_2SO_4/H_2O_2$ solution, an $HF/H_2O_2/H_2O$ solution, other etching solutions, or combinations thereof. In the depicted embodiment, the method 100 implements an APM solution (for etching, for example, an aluminum-based dielectric material), an $HNO_3/H_3PO_4/H_2O$ solution (for etching, for example, an aluminum-based dielectric material), an HF/H$_2$O$_2$/H$_2$O solution (for etching, for example, a titanium-based dielectric material), and/or H$_2$SO$_4$ (for etching, for example, a titanium-based dielectric material). As a result, the method 100 etches through the lower etch-stop layer 362 and exposes a portion of the conductive feature 330 at operation 118 such that the opening 372 extends through the ILD layer 368, the upper etch-stop layer 366, the middle etch-stop layer 364, and the lower etch-stop layer 362. In many embodiments, the wet etching process selectively etches through the lower etch-stop layer 362 without substantially removing portions of the conductive feature 330 or the ILD layer 328.

In the depicted embodiment, alternating metal-based and metal-free etch-stop layers provide features that would otherwise be difficult to obtain using a single metal-free (e.g., silicon-based) etch-stop layer. For example, because the metal-based etch-stop layers (e.g., the upper etch-stop layer 366 and the lower etch-stop layer 362) are thinner than the metal-free etch-stop layer (e.g., the middle etch-stop layer 364), using wet etching, which possesses greater lateral bias, may lead to a more efficient layer removal process without causing extensive lateral damage and sacrificing pattern line width resolution. On the other hand, because the metal-free etch-stop layer has less etch resistance and greater thickness than the metal-based etch-stop layers, using dry etching, which has greater directional bias, may improve pattern line width resolution without sacrificing layer removal efficiency. Additionally, the metal-based etch-stop layers described herein may possess a lower etch rate when etched by a dry etching plasma than the metal-free etch-stop layer due to a reaction by-product of such dry etching having a high boiling point. Accordingly, alternating metal-based and metal-free etch-stop layers with their respective etching methods may provide enhanced etch selectivity and improved pattern line width resolution when the two etch-stop layers are etched in sequence.

Figure 14:
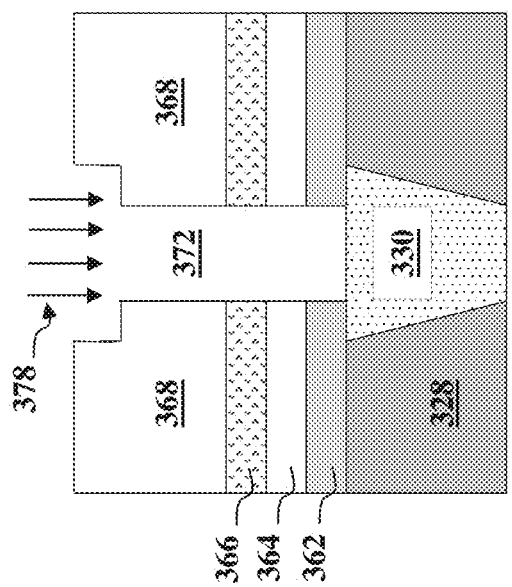

Referring to FIGS. 1B and 14, the method 100 forms a barrier layer 380 in the opening 372 at operation 120. The barrier layer 380 may include any suitable material such as titanium nitride, tantalum nitride, other materials, or combinations thereof. The barrier layer 380 may be formed by any suitable method such as CVD, PVD, ALD, or other methods.

Referring to FIGS. 1B, 15, and 16, the method 100 forms a conductive feature 384 over the barrier layer 380 at operation 122. In the depicted embodiment, referring to FIG. 15, the method 100 deposits a conductive material 382 in the opening 372 such that the conductive material 382 extends through the ILD layer 368, the upper etch-stop layer 366, the middle etch-stop layer 364, and the lower etch-stop layer 362. The conductive material 382 may include any suitable material such as copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), other conductive materials, or combinations thereof. For embodiments in which the conductive material 382 is copper, the method 100 may first form a copper seed layer (not shown) in the opening 372 before depositing the conductive material 382. Referring to FIG. 16, the method 100 may then perform a chemical-mechanical polishing/planarizing (CMP) process to remove any excess material from a top surface of the ILD layer 368 to form the conductive feature 384. In the depicted embodiment, the CMP process also removes the barrier layer 380 disposed on the top surface of the ILD layer 368.

Referring to FIG. 1B, the method 100 may perform additional steps to complete fabrication at operation 124. For example, additional vertical interconnect features such as contacts and/or vias, and/or horizontal interconnect features such as lines, and multilayer interconnect features such as metal layers and interlayer dielectrics can be formed over the workpiece 300. The various interconnect features may implement various conductive materials including copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, other suitable materials, or combinations thereof. The metal silicides may include nickel silicide, cobalt silicide, tungsten silicide, tantalum silicide, titanium silicide, platinum silicide, erbium silicide, palladium silicide, or combinations thereof. The workpiece 300 may be included in a microprocessor, a memory, and/or other integrated circuit device. The workpiece 300 may be a portion of an IC chip, a system on chip (SoC), or portion thereof, that includes various passive and active microelectronic devices such as resistors, capacitors, inductors, diodes, MOSFET, complementary metal-oxide semiconductor (CMOS) transistors, bipolar junction transistors (BJTs), laterally diffused MOS (LDMOS) transistors, high voltage transistors, high frequency transistors, other suitable components, or combinations thereof.

In some embodiments, the underlying structures 300A and 300B may be formed by an exemplary method described with reference to FIGS. 2, 3A, and 3B. Referring to FIGS. 2 and 3A, the method 200 provides a substrate 312 at operation 202. The substrate 312 may comprise an elementary (single element) semiconductor, such as germanium and/or silicon; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride (CaF$_2$); and/or combinations thereof. The substrate 312 may be a single-layer material having a uniform composition; alternatively, the substrate 312 may include multiple material layers having similar or different compositions suitable for IC device manufacturing.

At operation 204, the method 200 forms isolation features (not shown) on the substrate 312. The isolation features may include, for example, silicon oxide, silicon nitride, silicon oxynitride, fluorine-doped silicate glass (FSG), a low-k dielectric material, other suitable dielectric materials, or combinations thereof. The isolation features can include structures such as shallow trench isolation (STI) structures, deep trench isolation (DTI) structures, and/or local oxidation of silicon (LOCOS) structures.

At operation 206, the method 200 forms a dummy gate structure (not shown)—portions of which are replaced in a subsequent step—over the substrate 312. The dummy gate structure may include a dummy interfacial layer comprising silicon oxide or silicon oxynitride and a dummy gate electrode comprising polysilicon. The dummy gate structure may be formed by a series of deposition and patterning processes. Thereafter, still referring to FIGS. 2 and 3A, the method 200 at operation 206 forms gate spacers 324 along sidewalls of the dummy gate structure. The gate spacers 324 may include a dielectric material, such as silicon oxide, silicon nitride, silicon oxynitride, silicon carbide, other dielectric material, or combinations thereof, and may be formed by a deposition process followed by an anisotropic etching process.

The method 200 at operation 208 forms source/drain features 316 adjacent to the dummy gate structure, thereby forming a channel region 318 below the dummy gate structure and between the source/drain features 316. The source/drain features 316 may be n-type features for forming NMOS devices or p-type features for forming PMOS devices. In some embodiments, the source/drain features 316 may be formed by doping source/drain regions in the substrate 312 adjacent to the dummy gate structure with one or more n-type dopants or p-type dopants, depending on the nature of the devices desired, by a method such as ion implantation. In alternative embodiments, the method 200 at operation 208 forms the source/drain features 316 by epitaxially growing doped semiconductor material layer(s) in the source/drain regions. In further embodiments, the method 200 at operation 208 forms the source/drain features 316 by first recessing portions of the source/drain regions to form trenches and subsequently epitaxially growing semiconductor layer(s) in the trenches. For a p-type field-effect transistor (FET), the epitaxially grown semiconductor material may be silicon germanium while the epitaxially grown semiconductor material for an n-type FET may be silicon or silicon carbide. In some embodiments, the dopants are introduced into the source/drain features 316 by in-situ doping. In some embodiments, the method 200 at operation 208 subsequently forms an etch-stop layer (not shown) over the source/drain features 316, the dummy gate structure, and the isolation features.

Thereafter, at operation 210, the method 200 forms an ILD layer 326 over the source/drain features 316, the dummy gate structure, and the isolation features. The ILD layer 326 may be similar to the ILD layer 368 described with respect to FIG. 7 and may be formed by a deposition process, such as spin-on coating, CVD, other suitable methods, or combinations thereof. The method 200 at operation 210 further implements a planarization process, such as CMP, to remove excess ILD material from a top surface of the ILD layer 326 and to expose a top surface of the dummy gate structure.

At operation 212, still referring to FIGS. 2 and 3A, the method 200 replaces the dummy gate structure with a high-k metal gate (HK MG) structure 314. The method 200 at operation 212 removes portions of the dummy gate structure to form a gate trench (not shown) and subsequently forms the HK MG structure 314 in the gate trench by a series of patterning and deposition processes. Thus formed gate material layers (e.g., the gate dielectric layer 322 and the gate electrode 320 described below) may be U-shaped. Thereafter, a planarization process, such as CMP, is performed to remove excessive metal gate and/or high-k materials from a top surface of the HK MG structure 314.

The HK MG structure 314 may include at least a gate dielectric layer 322 and a gate electrode 320. The gate dielectric layer 322 may include one or more high-k dielectric materials (or one or more layers of high-k dielectric materials), such as hafnium silicon oxide (HfSiO), hafnium oxide (HfO$_2$), alumina (Al$_2$O$_3$), zirconium oxide (ZrO$_2$), lanthanum oxide (La$_2$O$_3$), titanium oxide (TiO$_2$), yttrium oxide (Y$_2$O$_3$), strontium titanate (SrTiO$_3$), or a combination thereof. The gate electrode 320 may include multiple metal layers such as, for example, work-function metal layer(s) and bulk conductive layer(s). The gate dielectric layer 322 and the gate electrode 320 may each be formed by a suitable deposition process such as CVD, PVD, and/or ALD. In many embodiments, the HK MG structure 314 includes additional metal layers such as, for example, interfacial layers, capping layers, diffusion layers, barrier layers, and other suitable layers.

At operation 214, the method 200 forms another ILD layer 328 over the ILD layer 326 and the HK MG structure 314. The ILD layer 328 may comprise a material that is similar to that of the ILD layer 326 and may be formed by a deposition process, such as spin-on coating, CVD, other suitable methods, or combinations thereof. The method 200 at operation 214 may further implement a CMP process to remove excess material from the top surface of the ILD layer 328.

Still referring to FIGS. 2 and 3A, the method 200 at operation 216 forms conductive features 330. In some embodiments, the conductive features 330 are formed by a single-damascene process that includes a series of patterning, deposition, a CMP processes. For example, the method 200 may first perform a patterning process (including lithography process and etching) to form an opening (not shown) in the ILD layer 328 and the ILD layer 326. In the depicted embodiment, the opening is formed directly above the top surface of the source/drain features 316. The patterning process at operation 216 is similar to that described with respect to operation 112 of the method 100 (FIG. 1A). Thereafter, the method 200 deposits a conductive material in the opening to form the conductive features 330. The conductive material may include copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), other suitable conductive materials, or combinations thereof. The conductive material may be deposited by any suitable process such as ALD, CVD, PVD, plating, other suitable methods, or combinations thereof. Subsequently, a CMP process may be performed to remove excess conductive material from a top surface of the conductive features 330.

Referring to FIGS. 2 and 3B, the method 200 may form additional conductive features at operation 218. The method 200 may form conductive features 344 and 346 in an ILD layer 342, which together form a metallization layer 340, over the ILD layer 328 and the conductive features 330. The method 200 may additionally form another metallization layer 350 over the metallization layer 340. The metallization layer 350 may include conductive features 356 and 354 formed in another ILD layer 352. In some embodiments, the conductive feature 354 is a via that establishes an electrical connection between the conductive feature 346 (i.e., a metal line) and the conductive feature 356. The conductive features 344, 346, 354, and 356 may each include any suitable conductive material and may be formed by any suitable methods. In one example, the conductive features within each metallization layer may be formed in multiple single-damascene process or collectively in a dual-damascene process as described in detail with respect to operation 112 of the method 100 (FIG. 1A).

Although not limiting, one or more embodiments of the present disclosure offer improvements for semiconductor devices and methods of fabricating the same. For example, embodiments of the present disclosure provide methods of forming conductive interconnect structures in IC devices. By incorporating alternating layers of metal-based and metal-free etch-stop layers having different layer thicknesses, as well as alternating wet and dry etching methods, etch selectivity and pattern line width resolution may be improved during multiple patterning processes, leading to greater control of critical dimension and depth of profile of the features thus formed.

Accordingly, the present disclosure provides many different embodiments for fabricating a semiconductor device. In one aspect, the present disclosure provides a semiconductor structure that includes a conductive feature, a composite etch-stop layer including a first metal-based etch-stop, a metal-free etch-stop layer, and a second metal-based etch-stop layer, an interlayer dielectric layer over the composite etch-stop layer, and a conductive interconnect structure extending through the interlayer dielectric layer and the composite etch-stop layer. In some embodiments, the first metal-based etch-stop layer includes a first metallic component, while the second metal-based etch-stop layer includes a second metallic component. In some embodiments, a bottom portion of the conductive interconnect structure directly contacts the conductive feature.

In some embodiments, the first metallic component includes aluminum, tantalum, titanium, hafnium, or combinations thereof. In further embodiments, the second metallic component is the same as the first metallic component.

In some embodiments, the metal-free etch-stop layer includes a silicon-containing dielectric material. In further embodiments, the first metal-based etch-stop layer and the second metal-based etch-stop layer are both free of silicon.

In some embodiments, the conductive interconnect structure includes a metal layer and a barrier layer, the barrier layer being disposed between the metal layer and the interlayer dielectric layer.

In some embodiments, a thickness of the first metal-based etch-stop layer is similar to that of the second metal-based etch-stop layer, and wherein a thickness of the metal-free etch-stop layer is at least 1.5 times that of the first metal-based etch-stop layer.

In another aspect, the present disclosure provides a method that includes forming an underlying conductive structure, depositing a metal-containing etch-stop layer over the underlying conductive structure, forming a silicon-containing etch-stop layer over the first metal-containing etch-stop layer, forming an interlayer dielectric layer over the silicon-containing etch-stop layer, patterning the interlayer dielectric layer to form an opening in the interlayer dielectric layer, etching the silicon-containing etch-stop layer in a first etching process, etching the metal-containing etch-stop layer in a second etching process, and forming a conductive feature in the opening of the interlayer dielectric layer, wherein the conductive feature directly contacts the underlying conductive structure.

In some embodiments, the first etching process includes a dry etching process implemented using a carbon- and fluorine-containing etchant gas and the second etching process includes a wet etching process implemented using a solution including $HNO_3$, $H_3PO_4$, $H_2SO_4$, $H_2O$, or combinations thereof.

In some embodiments, forming the conductive feature in the opening of the interlayer dielectric layer includes depositing a barrier layer in the opening and depositing a layering of conductive material over the barrier layer. In further embodiments, forming the conductive feature in the opening of the interlayer dielectric layer further includes performing a chemical-mechanical polishing process to remove excess conductive material.

In some embodiments, the method further includes forming a nitride-containing hard mask layer over the interlayer dielectric layer before patterning the interlayer dielectric layer.

In some embodiments, the metal-containing etch-stop layer is a first metal-containing etch-stop layer, and the method further includes forming a second metal-containing etch-stop layer over the silicon-containing etch-stop layer. In further embodiments, the method further includes etching the second metal-containing etch-stop layer in a third etching process before etching the silicon-containing etch-stop layer. In still further embodiments, the first etching process includes a dry etching process implemented using a carbon-, hydrogen-, and fluorine-containing etchant gas, and the second etching process and the third etching process each includes a wet etching process implemented using a solution including $HNO_3$, $H_3PO_4$, $NH_4OH$, $H_2O_2$, $HF$, $H_2SO_4$, $H_2O$, or combinations thereof.

In yet another aspect, the present disclosure provides a method that includes forming a first conductive feature, forming an etch-stop layer over the first conductive feature, forming a dielectric layer over the etch-stop layer, patterning the dielectric layer to form an opening, performing a first wet etching process to remove portions of the second metal-containing sub-layer in the opening, performing a dry etching process to remove portions of the metal-free sub-layer in the opening, performing a second wet etching process to remove portions of the first metal-containing sub-layer in the opening, forming a barrier layer in the opening, and forming a second conductive feature in the opening such that the second conductive feature contacts the barrier layer. In some embodiments, the etch-stop layer includes a first metal-containing sub-layer formed over the first conductive feature, a metal-free sub-layer formed over the first metal-containing sub-layer, and a second metal-containing sub-layer formed over the metal-free sub-layer. In some embodiments, the metal-free sub-layer includes a silicon-based material.

In some embodiments, the first metal-containing sub-layer and the second metal-containing sub-layer each includes aluminum, tantalum, titanium, hafnium, or combinations thereof. In further embodiments, the first metal-containing sub-layer includes an aluminum-based material.

In some embodiments, the forming of the etch-stop layer includes forming the first metal-containing sub-layer by a first deposition process, forming the metal-free sub-layer over the first metal-containing sub-layer by a spin-coating process, and forming the second metal-containing sub-layer over the metal-free sub-layer by a second deposition process similar to the first deposition process, the first and the second deposition process each including one of chemical vapor deposition, physical vapor deposition, and atomic layer deposition.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first conductive feature;
   a first metal-based etch-stop layer disposed directly on the first conductive feature, wherein the first metal-based etch-stop layer includes a first metallic component and is substantially free of silicon;
   a metal-free etch-stop layer disposed directly on the first metal-based etch-stop layer; and
   a second metal-based etch-stop layer disposed directly on the metal-free etch-stop layer, wherein the second metal-based etch-stop layer includes a second metallic component and is substantially free of silicon, wherein the first metallic component is formed of a different material than the second metallic component; and a conductive material extending through the first metal-based etch-stop layer, the metal-free etch-stop layer and the second metal-based etch-stop layer, wherein a portion of the conductive material interfaces with the first conductive feature.

2. The device of claim 1, further comprising:
a gate structure disposed over a substrate;
a source/drain feature associated with the gate structure and disposed on the substrate, and
wherein the first conductive feature includes a contact feature extending to the source/drain feature.

3. The device of claim 1, wherein the metal-free etch-stop layer include a silicon containing material.

4. The device of claim 3, wherein the silicon containing material includes a material selected from the group consisting of silicon oxide, silicon nitride, silicon carbide and silicon oxynitride.

5. The device of claim 1, wherein the first metal-based etch-stop layer includes a material selected from the group consisting of a metal oxide, a metal nitride, a metal carbide and a metal oxynitride, and
wherein the second metal-based etch-stop layer includes a material selected from the group consisting of a metal oxide, a metal nitride, a metal carbide and a metal oxynitride.

6. A device comprising:
a first conductive feature;
a first dielectric etch-stop layer disposed directly on the first conductive feature, wherein the first dielectric etch-stop layer includes a first metallic component;
a metal-free etch-stop layer disposed directly on the first dielectric etch-stop layer, the metal-free etch-stop layer having a thickness that is at least 1.5 times a thickness of the first dielectric etch-stop layer;
a second dielectric etch-stop layer disposed directly on the metal-free etch-stop layer, wherein the second dielectric etch-stop layer includes a second metallic component; and
a conductive material extending through and physically contracting each of the first metal-based etch-stop layer, the metal-free etch-stop layer and the second metal-based etch-stop layer, wherein a portion of the conductive material physically contacts the first conductive feature.

7. The device of claim 6, wherein the first metallic component includes a material selected from the group consisting of aluminum (Al), tantalum (Ta), titanium (Ti), hafnium (Hf), molybdenum (Mo), silver (Ag), gold (Au), manganese (Mn) and zirconium (Zr),
wherein the second metallic component includes a material selected from the group consisting of aluminum (Al), tantalum (Ta), titanium (Ti), hafnium (Hf), molybdenum (Mo), silver (Ag), gold (Au), manganese (Mn) and zirconium (Zr).

8. The device of claim 7, wherein the first metallic component is formed of a different material than the second metallic component.

9. The device of claim 6, wherein at least one of the first dielectric etch-stop layer and the second dielectric etch-stop layer is substantially free of silicon.

10. The device of claim 6, wherein the first dielectric etch-stop layer and the second dielectric etch-stop layer are substantially free of silicon, and wherein the metal-free etch-stop layer includes a silicon containing material.

11. The device of claim 6, wherein the metal-free etch-stop layer includes a material selected from the group consisting of an oxide, a nitride, a carbide, and an oxynitride.

12. The device of claim 6, wherein the first conductive feature includes a metal material.

13. A method comprising:
forming a first dielectric etch-stop layer over a conductive structure, the first dielectric etch-stop layer including a first metal and being substantially free of silicon;
forming a silicon-containing etch-stop layer over the first dielectric etch-stop layer;
forming a second dielectric etch-stop layer over the silicon-containing etch-stop layer, the second dielectric etch-stop layer including a second metal and being substantially free of silicon;
forming a trench extending through the first dielectric etch-stop layer, the silicon-containing etch-stop layer and the second dielectric etch-stop layer, wherein the forming of the trench extending through the first dielectric etch-stop layer, the silicon-containing etch-stop layer and the second dielectric etch-stop layer includes:
performing a first wet etching process to etch a portion of the second dielectric etch-stop layer;
performing a dry etching process to etch a portion of the silicon-containing etch-stop layer; and
performing a second wet etching process to etch a portion of the first dielectric etch-stop layer; and
forming a conductive material in the trench.

14. The method of claim 13, wherein the conductive structure is part of an interconnect structure.

15. The method of claim 13, further comprising forming an interlayer dielectric layer over the first dielectric etch-stop layer, and
wherein the forming of the trench extending through the first dielectric etch-stop layer, the silicon-containing etch-stop layer and the second dielectric etch-stop layer includes forming the trench through the interlayer dielectric layer.

16. The method of claim 15, wherein the trench has a first width and second width in the interlayer dielectric layer, the first width being different than the second width, and
wherein the conductive material has the first width and the second width.

17. The method of claim 13, wherein a portion of the conductive structure is exposed within the trench, and
wherein the forming of the conductive material in the trench includes forming the conductive material directly on the portion of the conductive structure.

18. The method of claim 13, wherein the first metal is different than the second metal.

19. The device of claim 1, wherein the metal-free etch-stop layer has a thickness that is at least 1.5 times a thickness of the second metal-based etch-stop layer.

20. The device of claim 1, wherein the metal-free etch-stop layer includes a material selected from the group consisting of an oxide, a nitride, a carbide, and an oxynitride.

* * * * *